(12) United States Patent
Yumoto et al.

(10) Patent No.: US 7,009,402 B2
(45) Date of Patent: Mar. 7, 2006

(54) ESTIMATING APPARATUS AND METHOD OF INPUT AND OUTPUT ENABLING POWERS FOR SECONDARY CELL

(75) Inventors: Daijiro Yumoto, Kanagawa (JP); Hideo Nakamura, Yokohama (JP)

(73) Assignee: Nissan Motor Co., Ltd., Yokohama (JP)

( * ) Notice: Subject to any disclaimer, the term of this patent is extended or adjusted under 35 U.S.C. 154(b) by 130 days.

(21) Appl. No.: 10/774,574

(22) Filed: Feb. 10, 2004

(65) Prior Publication Data
US 2004/0169495 A1 Sep. 2, 2004

(30) Foreign Application Priority Data
Feb. 28, 2003 (JP) .............................. 2003-054035

(51) Int. Cl.
*G01N 27/416* (2006.01)
(52) U.S. Cl. ..................................................... 324/433
(58) Field of Classification Search ........ 324/426–433; 320/132; 702/63
See application file for complete search history.

(56) References Cited

U.S. PATENT DOCUMENTS 5,672,951 A * 9/1997 Shiota ..................... 320/132
6,531,875 B1 * 3/2003 Satake ..................... 324/429

FOREIGN PATENT DOCUMENTS

JP 9-171063 A 6/1997

(Continued)

OTHER PUBLICATIONS

U.S. Appl. No. 10/695,800, filed Oct. 30, 2003, Yumoto et al.

*Primary Examiner*—Pia Tibbits
(74) *Attorney, Agent, or Firm*—Foley & Lardner LLP

(57) ABSTRACT

In input and output enabling power estimating apparatus and method for a secondary cell, an input enabling power ($P_{in}$) of the secondary cell is estimated on the basis of parameter estimated values (θ) and an open-circuit voltage (Vo), and an output enabling power ($P_{out}$) of the secondary cell is estimated on the basis of the parameter estimated values and the open-circuit voltage (Vo), the parameters are integrally estimated from at least one of equations (1) and (2):

$$V = \frac{B(s)}{A(s)} \cdot I + \frac{1}{C(s)} \cdot Vo, \tag{1}$$

wherein $$A(s) = \sum_{k=0}^{n} a_k \cdot s^k, \ B(s) = \sum_{k=0}^{n} b_k \cdot s^k, \ C(s) = \sum_{k=0}^{n} c_k \cdot s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and $$V = \frac{B(s)}{A(s)} \cdot I + \frac{1}{A(s)} \cdot Vo, \tag{2}$$

wherein $$A(s) = \sum_{k=0}^{n} a_k \cdot s^k \text{ and } B(s) = \sum_{k=0}^{n} b_k \cdot s^k.$$

20 Claims, 8 Drawing Sheets

FOREIGN PATENT DOCUMENTS

| | | | |
|---|---|---|---|
| JP | 2000-30748 A | | 1/2000 |
| JP | 2000199679 | * | 1/2000 |
| JP | 2002365961 | * | 6/2000 |
| JP | 2002-6010 A | | 1/2002 |
| JP | 2003-75518 A | | 3/2003 |
| SU | 853 715 | | 8/1981 |

* cited by examiner

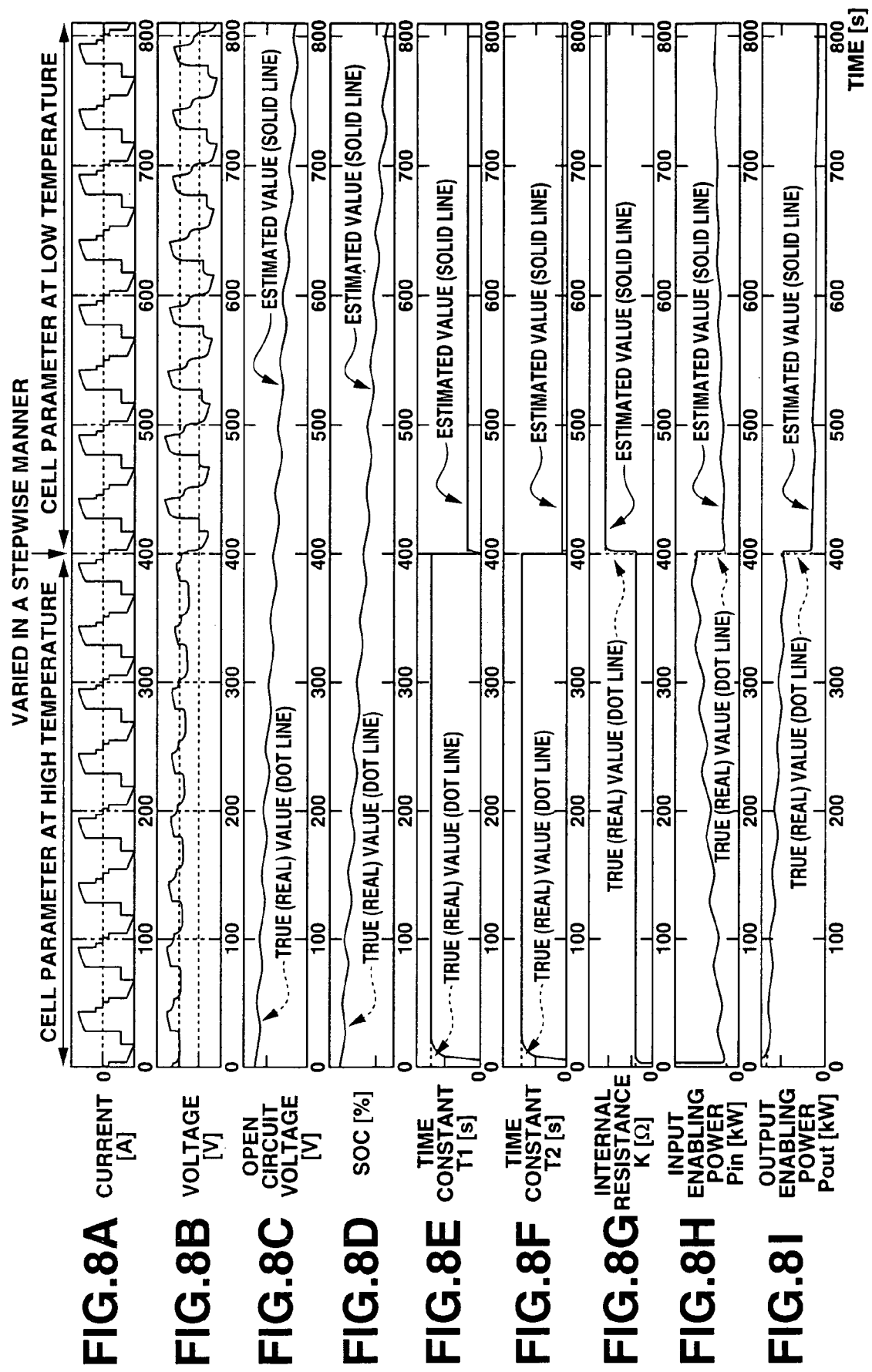

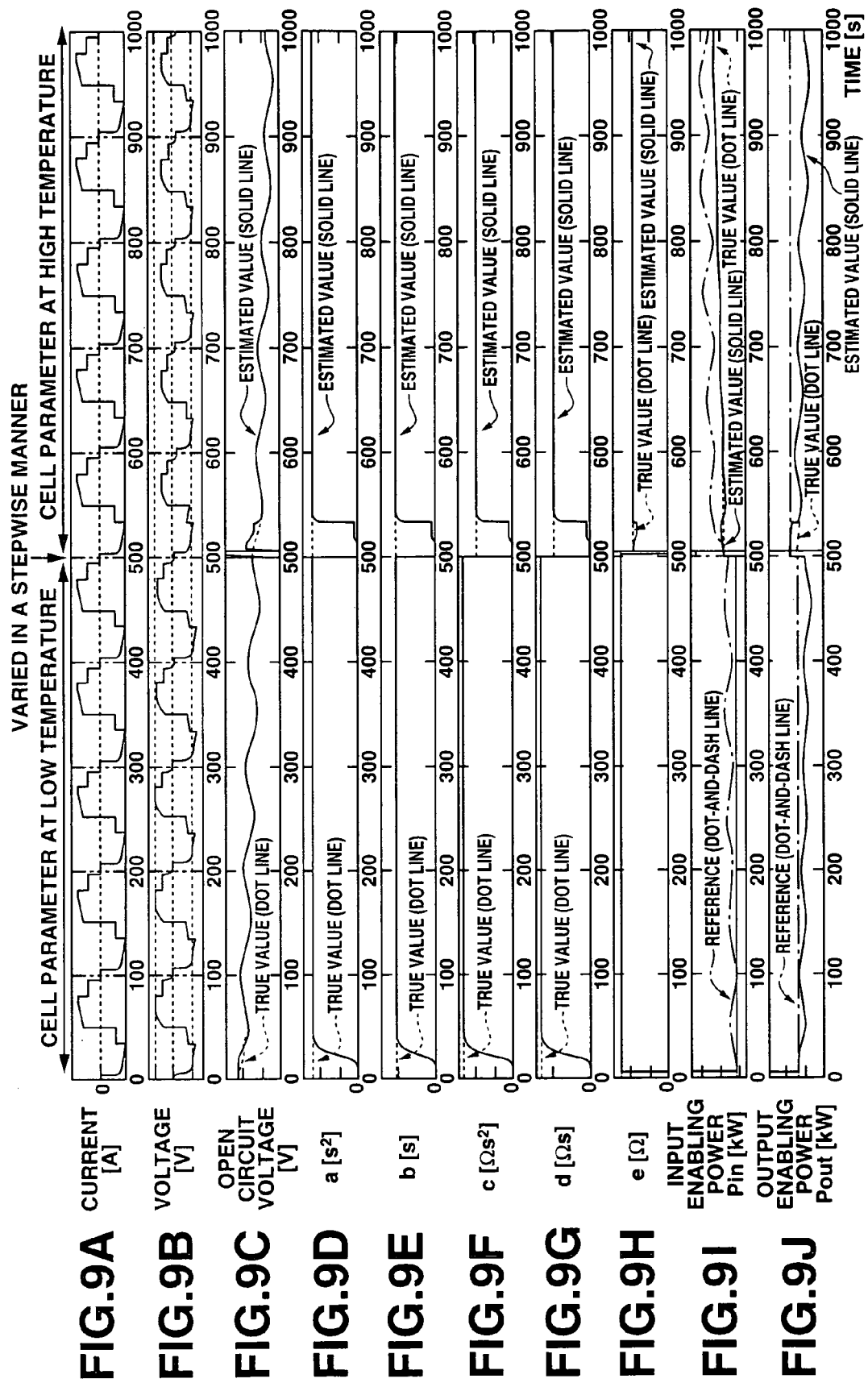

ESTIMATING APPARATUS AND METHOD OF INPUT AND OUTPUT ENABLING POWERS FOR SECONDARY CELL

BACKGROUND OF THE INVENTION

1. Field of the Invention

The present invention relates to a technique to estimate powers which are enabled to be inputted to a secondary cell and which are enabled to be outputted from the same secondary cell.

2. Description of the Related Art

A Japanese Patent Application First Publication No. Heisei 9-171063 published on Jun. 30, 1997 exemplifies a previously proposed battery power calculating apparatus. In the previously proposed battery power calculating apparatus described in the above-identified Japanese Patent Application First Publication, an equation (V=R×I+Vo) expressing an I-V straight line characteristic representing a discharge characteristic of the cell is calculated on the basis of a current I and a terminal voltage V supplied from a cell, an internal resistance R of the cell is calculated from its gradient, and an electromotive force Vo (which corresponds to a terminal voltage during a current interruption and also called an open voltage or open-circuit voltage) of the cell is calculated from an intercept. A minimum guarantee voltage value $V_{min}$ to guarantee a cell life on the basis of current I and cell temperature T is calculated and is substituted into the equation of I-V straight line to determine a maximum current value $I_{max}$. The output enabling power value P is calculated from an equation of $P=V_{min} \times I_{max}$.

SUMMARY OF THE INVENTION

However, each of internal resistance R and open-circuit voltage V has a feature (characteristic) that each thereof R and V varies instantaneously (or continuously with respect to time) during charge-and-discharge operations in accordance with current I. In the above-described previously proposed power calculating apparatus disclosed in the above-identified Japanese Patent Application First Publication, current I and terminal voltage V are measured between two points during the charge operation in accordance with current I to calculate the I-V straight line. There is an assumption that internal resistance R and open-circuit voltage Vo determined from I-V straight line is not varied between two points. However, actually, since internal resistance R and open-circuit voltage Vo are instantaneously (or continuously) varied with respect to time, in the case of the calculation method disclosed in the above-described Japanese Patent Application First Publication, an estimation accuracy of output enabling power value P becomes lowered.

It is, therefore, an object of the present invention to provide estimating apparatus and method for the secondary cell which are capable of estimating the input and output enabling powers for the secondary cell with a high accuracy and which are well (sufficiently) correspondent to an actual characteristic of the secondary cell. It is noted that the output enabling power is defined as a power which can be outputted from the secondary cell and the input enabling power is defined as the power which can be inputted into the secondary cell.

According to one aspect of the present invention, there is provided an estimating apparatus for a secondary cell, comprising: a current detecting section that detects a current (I) charged into and discharged from the secondary cell; a voltage detecting section that detects a terminal voltage (V) across the secondary cell; a parameter estimating section that integrally estimates all parameters ($\theta$) at one time in at least one of the following equations (1) and (2) with the measured current (I) and terminal voltage (V) inputted into an adaptive digital filter using a cell model described in a corresponding one of the following equations (1) and (2) whose parameters are estimated; an open-circuit voltage calculating section that calculates an open-circuit voltage (Vo) using the current (I), the terminal voltage (V), and the parameter estimated values ($\theta$); an input enabling power estimating section that estimates an input enabling power ($P_{in}$) of the secondary cell on the basis of the parameter estimated values ($\theta$) and open-circuit voltage (Vo); and an output enabling power estimating section that estimates an output enabling power ($P_{out}$) of the secondary cell on the basis of the parameter estimated values and the open-circuit voltage (Vo), the equation (1) being $$V = \frac{B(s)}{A(s)} \cdot I + \frac{1}{C(s)} \cdot Vo, \quad (1)$$

wherein $$A(s) = \sum_{k=0}^{n} a_k \cdot s^k, \; B(s) = \sum_{k=0}^{n} b_k \cdot s^k, \; C(s) = \sum_{k=0}^{n} c_k \cdot s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and the equation (2) being $$V = \frac{B(s)}{A(s)} \cdot I + \frac{1}{A(s)} \cdot Vo, \quad (2)$$

wherein $$A(s) = \sum_{k=0}^{n} a_k \cdot s^k \text{ and } B(s) = \sum_{k=0}^{n} b_k \cdot s^k.$$

According to another aspect of the present invention, there is provided an estimating method for a secondary cell, comprising: detecting a current (I) charged into and discharged from the secondary cell; detecting a terminal voltage (V) across the secondary cell; integrally estimating all parameters ($\theta$) at one time in at least one of the following equations (1) and (2) with the measured current (I) and terminal voltage (V) inputted into an adaptive digital filter using a cell model described in a corresponding one of the following equations (1) and (2) whose parameters are estimated; calculating an open-circuit voltage (Vo) using the current (I), the terminal voltage (V), and the parameter estimated values ($\theta$); estimating an input enabling power ($P_{in}$) of the secondary cell on the basis of the parameter estimated values ($\theta$) and open-circuit voltage (Vo); and estimating an output enabling power ($P_{out}$) of the secondary cell on the basis of the parameter estimated values and the open-circuit voltage (Vo), the equation (1) being $$V = \frac{B(s)}{A(s)} \cdot I + \frac{1}{C(s)} \cdot Vo, \quad (1)$$

wherein

-continued $$A(s) = \sum_{k=0}^{n} a_k \bullet s^k, \; B(s) = \sum_{k=0}^{n} b_k \bullet s^k, \; C(s) = \sum_{k=0}^{n} c_k \bullet s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and the equation (2) being $$V = \frac{B(s)}{A(s)} \bullet I + \frac{1}{A(s)} \bullet Vo, \qquad (2)$$

wherein $$A(s) = \sum_{k=0}^{n} a_k \bullet s^k \text{ and } B(s) = \sum_{k=0}^{n} b_k \bullet s^k.$$

This summary of the invention does not necessarily describe all necessary features so that the invention may also be a sub-combination of these described features.

BRIEF DESCRIPTION OF THE DRAWINGS

FIGS. 8A, 8B, 8C, 8D, 8E, 8F, 8G, 8H, 8I show integrally a timing chart representing a result of a simulation based on the first embodiment of the input and output enabling power estimating apparatus according to the present invention.

FIGS. 9A, 9B, 9C, 9D, 9E, 9F, 9G, 9H, 9I, 9J show integrally a timing chart representing a result of a simulation based on the second embodiment of the input and output enabling power estimating apparatus according to the present invention.

DETAILED DESCRIPTION OF THE PREFERRED EMBODIMENTS

Reference will hereinafter be made to the drawings in order to facilitate a better understanding of the present invention.

Figure 1:
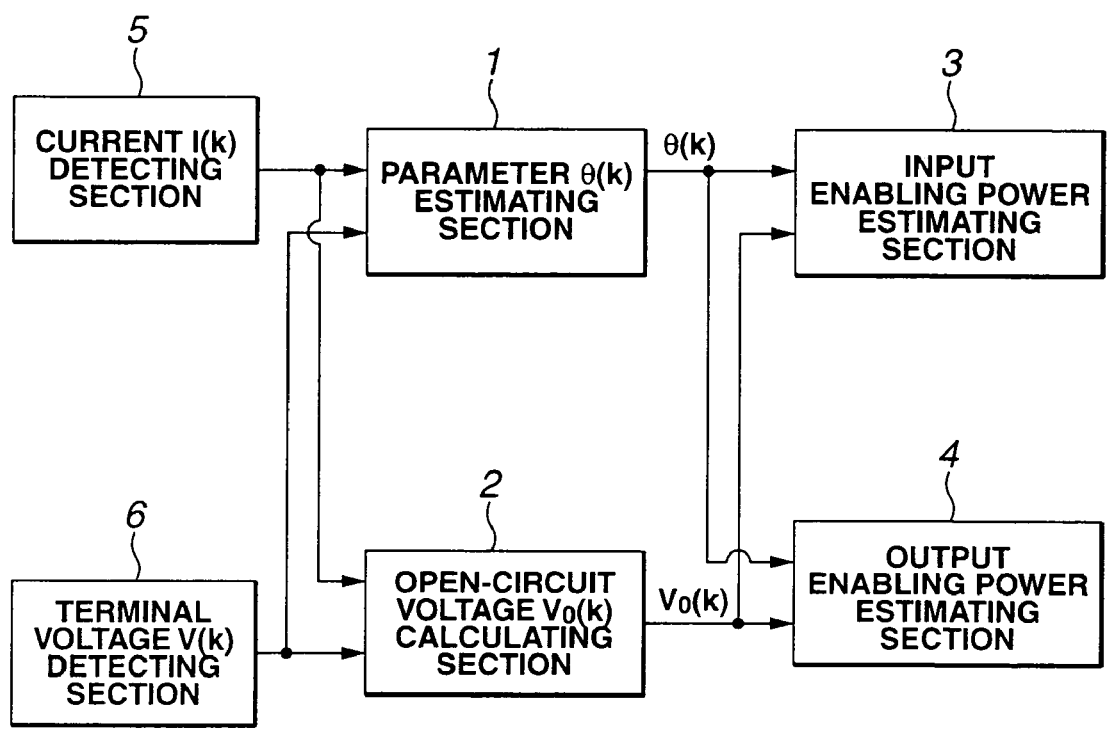
FIG. 1 is a functional block diagram of input and output enabling power estimating apparatus for a secondary cell according to the present invention applicable to each of first and second preferred embodiments.

FIG. 1 shows a functional block diagram of input and output enabling power estimating apparatus according to the present invention for explaining a general concept of each of first and second preferred embodiments which will be described later. In FIG. 1, a reference numeral 1 denotes a parameter θ(k) estimating section that integrally estimates each parameter (the detailed description thereof will herein be omitted) in a cell model in which an open-circuit voltage Vo(k) is an offset term using measured voltage V and current I detected by current I(k) detecting section 5 and terminal voltage V(k) detecting section 6. A reference numeral 2 denotes an open-circuit voltage calculating section Vo(k). The open-circuit voltage Vo(k) is calculated on the basis of the measured voltage V and current I and each estimated parameter. A reference numeral 3 denotes an input enabling power estimating section which estimates a power which can be inputted to the secondary cell on the basis of parameter θ(k) and open-circuit voltage Vo(k). A reference numeral 4 denotes an output enabling power estimating section that estimates the power which can be outputted from the secondary cell on the basis of parameter θ(k) and open-circuit voltage Vo(k). A reference numeral 5 denotes a current I(k) detecting section that detects the current charged to or discharged from the secondary cell. A reference numeral 6 denotes a terminal voltage V(k) detecting section that detects a terminal voltage of the cell.

Figure 2:
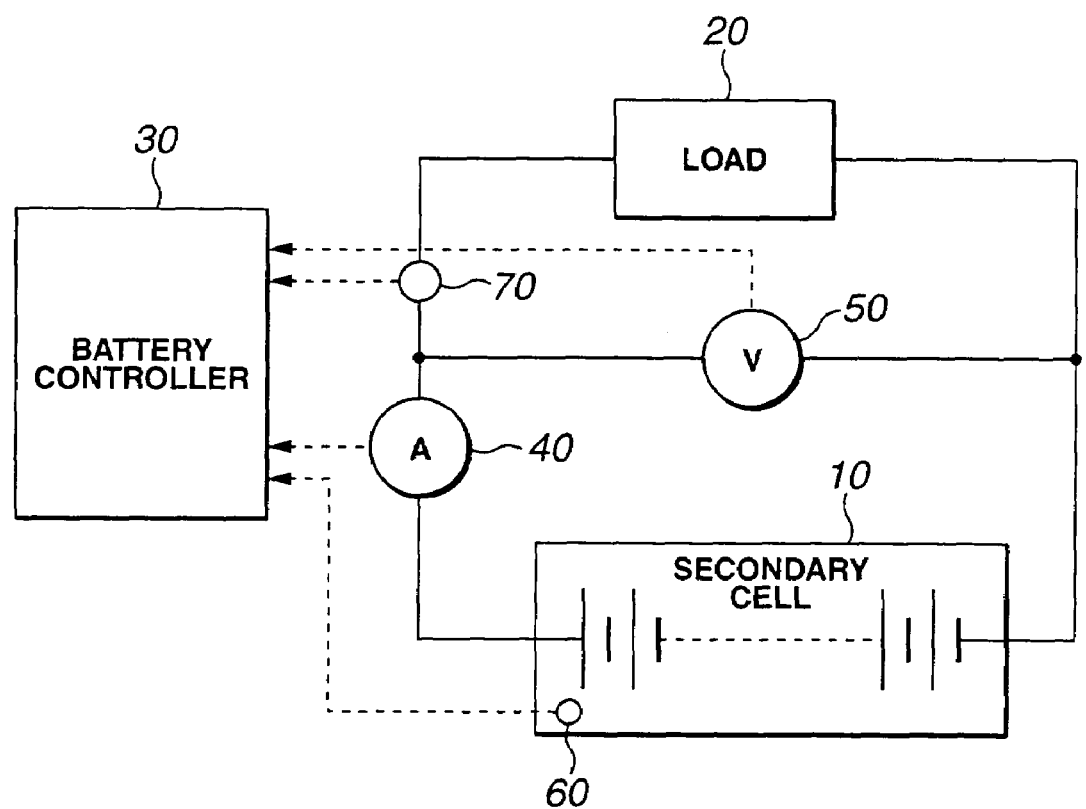
FIG. 2 is a specific circuit block diagram of a battery controller and a secondary cell load drive system to which the input and output enabling power estimating apparatus according to the present invention is applicable.

FIG. 2 shows a block diagram representing a specific structure of a battery controller and a secondary cell load driving system to which the input and output enabling power estimating apparatus according to the present invention is applicable. In this system, the input and output enabling power estimating apparatus is mounted in a system in which a load such as a motor is driven and a regenerative power of the motor is used to charge the secondary cell. In FIG. 2, a reference numeral 10 denotes a secondary cell (or merely, a cell), a reference numeral 20 denotes a load of the motor or so on, and a reference numeral 30 denotes a battery controller (an electronic control unit) which functions to estimate the input and output enabling powers of cell 10. Battery controller 30 includes a microcomputer including a CPU (Central Processing Unit) that calculates a program, a ROM (Read Only Memory) that stores the program, a RAM (Random Access Memory) storing a result of calculations, and electronic circuits. A reference numeral 40 denotes a current meter that measures (detects) a current which is charged into and discharged from secondary cell 10. A reference numeral 50 denotes a voltage meter to detect a terminal voltage across secondary cell 10. These meters are connected to battery controller 30. The above-described battery controller 30 corresponds to parameter θ(k) estimating section 1 of FIG. 1, open-circuit voltage Vo(k) calculating section 2, input enabling power estimating section 3, and output enabling power estimating section 4. In addition, current meter 40 corresponds to current I(k) detecting section 5 and voltage meter 50 corresponds to a terminal voltage V(k) detecting section 6, respectively. It is noted that a reference numeral 60 shown in FIG. 2 denotes a temperature sensor to detect a cell temperature and a reference numeral 70 shown in FIG. 2 denotes a relay circuit (or simply a relay).

(First Embodiment)

Figure 4:
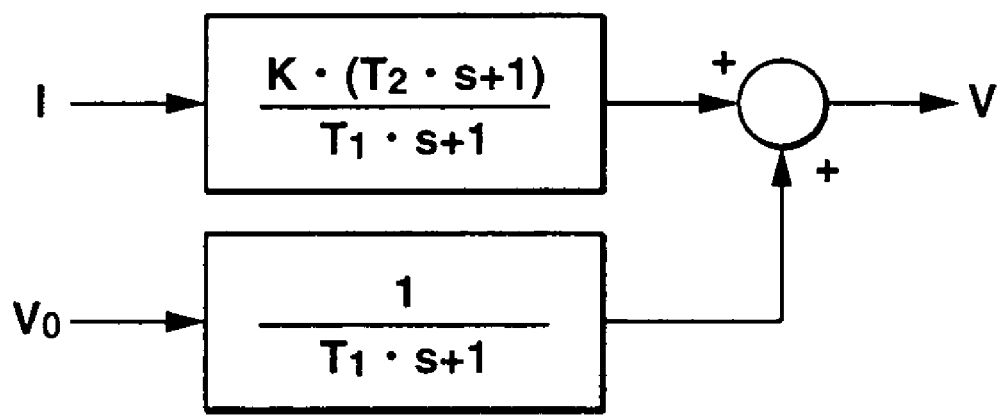
FIG. 4 is a model view representing an equivalent circuit model of the secondary cell in the input and output enabling power estimating apparatus of the first preferred embodiment.

Next, a, so-called, cell model used in the first embodiment will be described below. FIG. 4 shows an equivalent circuit model of the secondary cell in the first embodiment. This equivalent circuit model corresponds to a case where denominators of right side first term and right side second term are the same as shown in equation (2). This equivalent circuit model is a reduction model (first order or fist degree) in which positive pole and negative pole are not especially separated) but enabled to represent a relatively accurate charge-and-discharge characteristic of the actual cell. In FIG. 4, a model input is current I [A] (Amperes) (positive value is charge and negative value is discharge) and model output is a terminal voltage V[V]. Vo[V] denotes an open-circuit voltage (or called, an electromotive force or open voltage). K denotes an internal resistance, $T_1$ and $T_2$ denote time constants. The cell model can be expressed in the following equation (3). It is noted that s denotes a Laplace transform operator.

$$V = \frac{B(s)}{A(s)} \cdot I + \frac{1}{A(s)} \cdot Vo, \tag{2}$$

wherein $$A(s) = \sum_{k=0}^{n} a_k \cdot s^k, \quad B(s) = \sum_{k=0}^{n} b_K \cdot s^K$$

It is noted that A(s) and B(s) denote polynominals of s, n denotes a degree (order number), and $a_1 \neq 0$ and $b_1 \neq 0$.

$$V = \frac{K \cdot (T_2 \cdot s + 1)}{T_1 \cdot s + 1} \cdot I + \frac{1}{T_1 \cdot s + 1} \cdot V_0. \tag{3}$$

It is noted that equation (3) is a variation of equation (2) in which $T_1 \cdot s+1$ is substituted for and A(s) (A(s)=$T_1 \cdot +1$)) and $K \cdot (T_2 \cdot s+1)$ is substituted for B(s) (B(s)=$K \cdot (T_2 \cdot s+1)$). In the case of such a lithium ion battery that a convergence of the open-circuit voltage is relatively fast, the denominators of right side first term and right side second term can be represented by the same time constant $T_1$ as appreciated from equation (3).

Hereinafter, a procedure of a derivation from the cell model in equation (3) to an adaptive digital filter will first be explained. The open-circuit voltage Vo can be written in the following equation (4) assuming that a value of current I multiplied by a variable efficiency h is considered to be an integration value from a certain initial state.

$$Vo = \frac{h}{s} \cdot I. \tag{4}$$

If equation (4) is substituted into equation (3), the following equation (5) is given. If equation (5) is rearranged, the following equation (6) is given. If a stable low pass filter $G_{lp}(s)$ is multiplied to both sides of equation (6) and rearranged, then, the following equation (7) is given.

$$V = \frac{K \cdot (T_2 \cdot s + 1)}{T_1 \cdot s + 1} \cdot I + \frac{1}{T_1 \cdot s + 1} \cdot \frac{h}{s} \cdot I. \tag{5}$$

$$V = \frac{K \cdot T_2 \cdot s^2 + K \cdot s + h}{T_1 \cdot s + 1} \cdot \frac{h}{s} \cdot I. \tag{6}$$

$$G_{lp}(s) \cdot (T_1 \cdot s^2 + s) \cdot V = G_{lp}(s) \cdot (K \cdot T_2 \cdot s^2 + K \cdot s + h) \cdot I \tag{7}$$

A value of an actually measurable current I and terminal voltage V for which a low pas filter and a band pass filter are processed is defined as in the following equation (8). A time constant p of equation (8) is a constant determining a response characteristic of $G_{lp}(s)$.

$$\begin{aligned} V_3 &= s^2 \cdot G_{lp}(s) \cdot V & V_2 &= s \cdot G_{lp}(s) \cdot V & V_1 &= G_{lp}(s) \cdot V & G_{lp} &= \\ I_3 &= s^2 \cdot G_{lp}(s) \cdot I & I_2 &= s \cdot G_{lp}(s) \cdot I & I_1 &= G_{lp}(s) \cdot I & & \frac{1}{(p \cdot s + 1)^3} \end{aligned} \tag{8}$$

If, using equation (8), equation (7) is rewritten, then, the following equation (9) is given. Furthermore, if equation (9) is deformed, an equation (10) is given.

$$T_1 \cdot V_3 + V_2 = K \cdot T_2 \cdot I_3 + K \cdot I_2 + h \cdot I_1 \tag{9}$$

$$V_2 = -T_1 \cdot V_3 + K \cdot T_2 \cdot I_3 + K \cdot I_2 + d \cdot I_1 \tag{10}$$

$$= [V_3 \; I_3 \; I_2 \; I_1] \cdot \begin{bmatrix} -T_1 \\ K \cdot T_2 \\ K \\ h \end{bmatrix}.$$

Equation (10) indicates a product-and-sum equation between measurable value and unknown parameters. Hence, equation (10) is coincident with a standard form (equation (11)) of a general adaptive digital filter. It is noted that, in equation (11), $y=V_2$, $\omega^T=[V_3 \; I_3 \; I_2 \; I_1]$, $\theta^T=[-T_1 \; K \cdot T_2 \; Kh]$.

$$y = \omega^T \cdot \theta \tag{11}.$$

Hence, if current I and terminal voltage V to both of which a filter is processed are used for the adaptive digital filter calculation, unknown parameter vector θ can be estimated. In this embodiment, a, so-called, both eyes trace gain method which has improved a logical defect of the adaptive filter (namely, once an estimated value is converged, an accurate estimation, thereafter, cannot be made any more even if the parameter is varied) is used.

Upon an assumption of equation (11), a parameter estimation algorithm to estimate an unknown parameter vector θ is described in an equation (12). It is noted that parameter estimated values at a time point of k is assumed to be θ(k).

$$\begin{aligned} \gamma(k) &= \frac{\lambda_3}{1 + \lambda_3 \cdot \omega^T(k) \cdot P(k-1) \cdot \omega(k)} \\ \theta(k) &= \theta(k-1) - \gamma(k) \cdot P(k-1) \cdot \omega(k) \cdot [\omega^T(k) \cdot \theta(k-1) - y(k)] \\ P(k) &= \frac{1}{\lambda_1(k)} \left\{ P(k-1) - \frac{\lambda_3 \cdot P(k-1) \cdot \omega(k) \cdot \omega^T(k) \cdot P(k-1)}{1 + \lambda_3 \cdot \omega^T(k) \cdot P(k-1) \cdot \omega(k)} \right\} \\ &= \frac{P'}{\lambda_1(k)} \\ \lambda_1(k) &= \begin{cases} \frac{\text{trace}\{P'(k)\}}{\gamma_U} : \lambda_1 \leq \frac{\text{trace}\{P'(k)\}}{\gamma_U} \\ \lambda_1 : \frac{\text{trace}\{P'(k)\}}{\gamma_U} \leq \lambda_1 \leq \frac{\text{trace}\{P'(k)\}}{\gamma_L} \\ \frac{\text{trace}\{P'(k)\}}{\gamma_L} : \frac{\text{trace}\{P'(k)\}}{\gamma_L} \leq \lambda_1 \end{cases} \end{aligned} \tag{12}$$

In equation (12), $\lambda_1$, $\lambda_3$, $\gamma_U$, $\gamma_L$ denotes initial set values, $0<\lambda_1<1$, $0<\lambda_3<\infty$. In addition, P(0) is a sufficiently large initial value and trace{P} means a trace of a matrix P. In this way, the derivation of the adaptive digital filter from the cell model has been explained.

Figure 6:
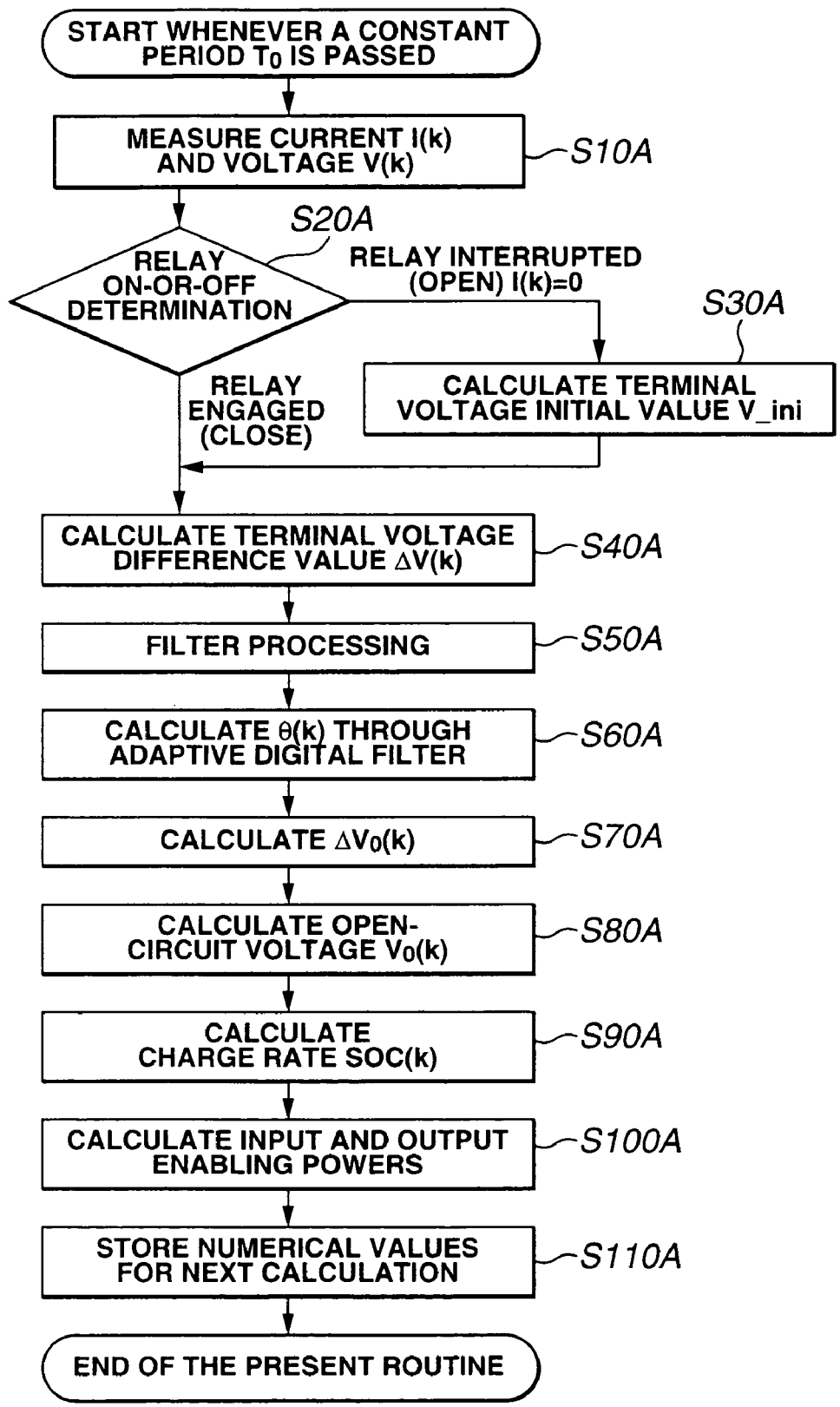
FIG. 6 is a processing flowchart representing a calculation process in the case of the first preferred embodiment of the input and output enabling power estimating apparatus according to the present invention.

FIG. 6 shows an operational flowchart executing a microcomputer of battery controller 30. The routine shown in FIG. 6 is repeated for each constant period of time $T_0$. For example, I(k) is the present value and I(k−1) is the value one time before the present time of k.

At a step S10A, battery controller 30 measures current I(k) and terminal voltage V(k). At a step S20A, battery controller 30 determines whether an interruption relay of secondary cell 10 is in an engaged state (closed) or in an interrupted state (open). It is noted that battery controller 30 also controls the interruption relay. If the relay is interrupted (current I=0), the routine goes to a step S30A. If the relay is engaged, the routine goes to a step S40A. At step S30A, battery controller 30 determines that terminal voltage V(k) is stored as terminal voltage initial value $V\_{ini}$. At step S40A, battery controller 30 a difference value of the terminal voltage $\Delta V(k)$: $\Delta V(k)=V(k)-V\_{ini}$. Since this the initial value of the estimation parameter within the adaptive digital filter is set to about zero, the inputs are all zeroed to prevent each estimated parameter during a start of an estimation calculation from being diverged. Whenever the relay is interrupted, the routine goes to step S30A. Hence, since I=0 and $\Delta V(k)=0$, the estimated parameters still remains in the initial state. At a step S50A, battery controller 30 performs a low pass filter (LPF) and a band pass filter (BPF) processing based on equation (13) for current I(k) and terminal voltage difference value $\Delta V(k)$ to calculate $I_1$ through $I_3$ and $V_1$ through $V_3$. At this time, in order to improve an estimation accuracy of the parameter estimation algorithm of equation (12), a response characteristic of low pass filter $G_{lp}(s)$ is set to be slow so as to reduce observed noises.

It is noted that this response characteristic is made faster than the response characteristic of the cell. Time constant p in equation (13) is a constant to determine the response characteristic of $G_{lp}(s)$ during the equation (13).

$$G_{1p}(s) = \frac{1}{(p \cdot s + 1)^3} \qquad (13)$$
$$V_3 = s^2 \cdot G_{lp}(s) \cdot V, \quad V_2 = s \cdot G_{lp}(s) \cdot V, \quad V_1 = G_{lp}(s) \cdot V$$
$$I_3 = s^2 \cdot G_{lp}(s) \cdot I, \quad I_2 = s \cdot G_{lp}(s) \cdot I, \quad I_1 = G_{lp}(s) \cdot I$$

At a step S60A, controller 30 substitutes $I_1$ through $I_3$ and $V_1$ through $V_3$ calculated at step S50A into equation (12) to calculate parameter estimated value $\theta(k)$. It is noted that $y=V_2$, $\omega^T=[V_3\ I_3\ I_2\ I_1]$, and $\theta^T=[-T_1\ K \cdot T_2\ K\ h]$.

At a step S70A, back-up controller 30 substitutes $T_1$, $K \cdot T_2$, and K from among parameter estimated value $\theta(k)$ calculated at step S60A into the following equation (14) from among parameter estimated values $\theta(k)$ calculated at step S60A into equation (14), $I_1$, and $I_2$, and $V_1$, and $V_2$ calculated at equation (13).

$$V_0 = (T_1 \cdot s + 1) \cdot V - K \cdot (T_2 \cdot s + 1) \cdot I \qquad (14)$$
$$\Delta V_0 = G_{1p}(s)$$
$$= G_{1p}(s) \cdot \{(T1 \cdot s + 1) \cdot V - K \cdot (T_2 \cdot s + 1) \cdot I\}$$
$$= V_1 + T_1 \cdot V_2 - K \cdot T_2 \cdot I_2 - K \cdot I_1.$$

Equation (14) is a deformation for the cell model (equation (3)) and low pass filter $G_{lp}(s)$ is multiplied to both sides. Then, voltage component of $\Delta Vo$ is replaced with open-circuit voltage Vo (Vo is substituted for $\Delta Vo$). Since the variation of open-circuit voltage Vo is moderate, Vo can be replaced as follows: $\Delta Vo = G_{lp}(s) \cdot Vo$.

Since variation rate $\Delta Vo(k)$ of the open-circuit voltage estimated value from a time at which the start of the estimated calculation is carried out, the initial value at the later stage of a step S80A.

At step S80A, the open-circuit voltage initial value, namely, a terminal voltage initial value $V\_{ini}$ is added to $\Delta Vc(k)$ calculated at step S70A to calculate open-circuit voltage estimated value Vo(k) using the following equation (15).

$$V_o(k)=\Delta V_o(k)+V\_{ini} \qquad (15).$$

Figure 3:
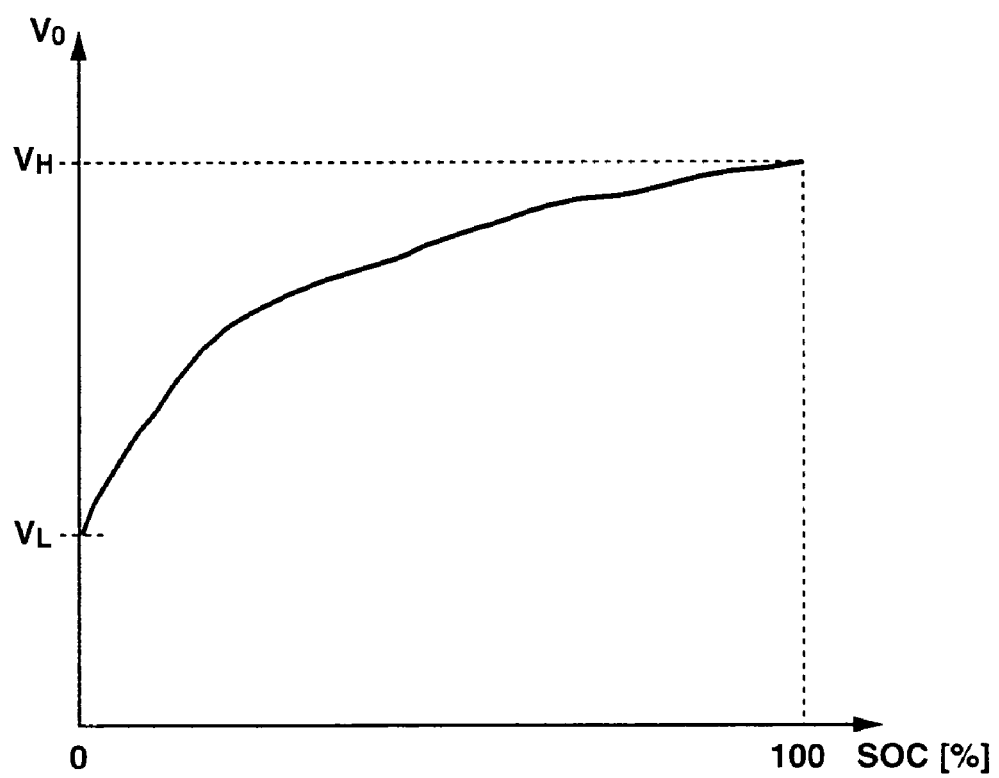
FIG. 3 is a map representing a relationship between an open-circuit voltage and a charge rate (SOC).

At a step S90A, battery controller 30 calculates a charge rate SOC(k) from Vo(k) calculated at step S80A using a correlative map of the open-circuit voltage shown in FIG. 3 and charge rate. It is noted that VL shown in FIG. 3 is an open-circuit voltage corresponding to SOC=100% and VH shown in FIG. 3 is an open-circuit voltage corresponding to SOC=100%.

At a step S100A, battery controller 30 calculates an input enabling power estimated value $P_{in}$ and an output enabling power estimated value $P_{out}$. Hereinafter, the detailed description of the calculation method of the input enabling power estimated value will be described below.

In the cell model (equation (3)), in a case where a transient characteristic is ignored, equation (16) is resulted. This means that this means a quantitative cell model.

$$V=K \cdot I + Vo \qquad (16).$$

Suppose that the terminal voltage of the cell immediately before a predefined excessive (or over) charge is resulted is a maximum enabling voltage $V_{max}$ and the terminal voltage of the cell immediately before the predefined excessive (or over) discharge is resulted in a minimum enabling voltage $V_{min}$. Then, in order to calculate the input enabling power estimated value Pin, it is necessary to require the current value by which the terminal voltage has reached to maximum enabling voltage $V_{max}$. Hence, using equation (16) in which the transient characteristic is ignored and equation (16) is used to calculate maximum input current $I_{in\_max}$ using equation (16).

In equation (16), maximum enabling voltage $V_{max}$ is substituted into V, estimated value K from among the parameter estimated values $\theta(k)$ calculated at step S60A is substituted into K and circuit voltage estimated value Vo(k) calculated at step S80A is substituted into Vo, respectively, to calculate a maximum input current $I_{in\_max}$.

In the same way as the case of output enabling power estimated value $P_{out}$, minimum enabling voltage $V_{min}$ is substituted into V in equation (16), estimated value K from among the parameter estimated value $\theta(k)$ calculated at step S60A is substituted into K, and circuit voltage estimated value Vo(k) calculated at step S80A is substituted into Vo, respectively, to calculate maximum input current $I_{in\_max}$. Then, input enabling power estimated value Pin and output enabling power estimated value $P_{out}$ are calculated from equation (17).

$$Pin = I_{in\_max} \cdot V_{max} \qquad (17)$$
$$= \frac{V_{max} - Vo}{K} \cdot V_{max}$$
$$P_{out} = |I_{out\_max}| \cdot V_{min}$$
$$= \frac{Vo - V_{min}}{K} \cdot V_{min}$$

Maximum enabling voltage $V_{max}$ is a terminal voltage in a case where the cell is charged to a voltage immediately before the cell is the excessive charge. Minimum enabling voltage $V_{min}$ is a terminal voltage in a case where the cell is discharged to a value immediately before the cell is the excessive charge. These maximum enabling voltage $V_{max}$ and minimum enabling voltage $V_{min}$ are variables determined by the kind of cells and the cell temperature. For example, a relationship between the cell temperature and $V_{max}$ determined according to, for example, the experiments and a relationship between the cell temperature and $V_{min}$ can be stored as maps and a map reference can be used to calculate $V_{max}$ and $V_{min}$. At a step S110A, numerical values required for the subsequent calculation are stored and the present calculation is ended. An operation of the first embodiment has been described above.

Hereinafter, an action and advantages of the estimating apparatus for the secondary cell in the first embodiment will be described below.

In the first embodiment, since the relationship between current I of the secondary cell, terminal voltage V, and the open-circuit voltage Vo approximates the transfer function such as in equation (2). Specifically, equation (3), it becomes possible to apply the adaptive digital filter (well known estimating algorithm) such as the method of the least square. Consequently, it becomes possible to integrally estimate the parameters in equations (coefficients of poly-nominals (A(s) and B(s)). When the estimated parameters are substituted into equation (2), the estimated value of open-circuit voltage Vo can easily be calculated.

These unknown parameters are affected by the charge rate (SOC), the cell temperature, and a degree of deterioration. Although these parameters are known to be instantaneously varied with respect to time, the adaptive digital filter can sequentially be estimated with a high accuracy. Since input enabling power $P_{in}$ and output enabling power $P_{out}$ are estimated using the estimated coefficient parameters and the open-circuit voltages Vo, the input and output enabling power $P_{in}$ and $P_{out}$ can be estimated, even if the input and output enabling powers are varied during the charge or discharge operation, its variation can accurately follow to estimate the input and output enabling powers.

As compared with the second preferred embodiment as will be described later, since an easier cell model (equations (2) and (3)) is used, a formalization (or an equalization) of the adaptive digital filter becomes easy and the numbers of times the calculations are carried out can be reduced.

FIGS. 8A through 8I show integrally results of simulations of the input and output enabling power estimations based on the first embodiment.

In FIGS. 8A through 8I, with a time of 400 seconds as a boundary, the cell parameters are changed in a stepwise manner from a high temperature corresponding value to a low temperature corresponding value. It is noted that, in this example of FIGS. 8A through 8I, such as a lithium ion battery, the cell having a fast convergence of the open-circuit voltage is presumed. As appreciated from FIGS. 8A through 8I, time constants $T_1$, $T_2$, and internal resistance K are considerably coincident with real values even if the cell parameter given when the simulations are carried out are varied in a stepwise manner. Hence, the open-circuit voltage estimated values are similarly coincident with the true values. In the first embodiment, using the estimated coefficient parameter, the open voltage Vo, and maximum enabling voltage $V_{min}$, input enabling power $P_{in}$ is estimated. Hence, even if cell parameters and open-circuit voltage Vo are instantaneously varied with respect to time during the charge or discharge operation, the output enabling power estimated value is accurately coincident with the true value (real value).

(Second Embodiment)

Figure 5:
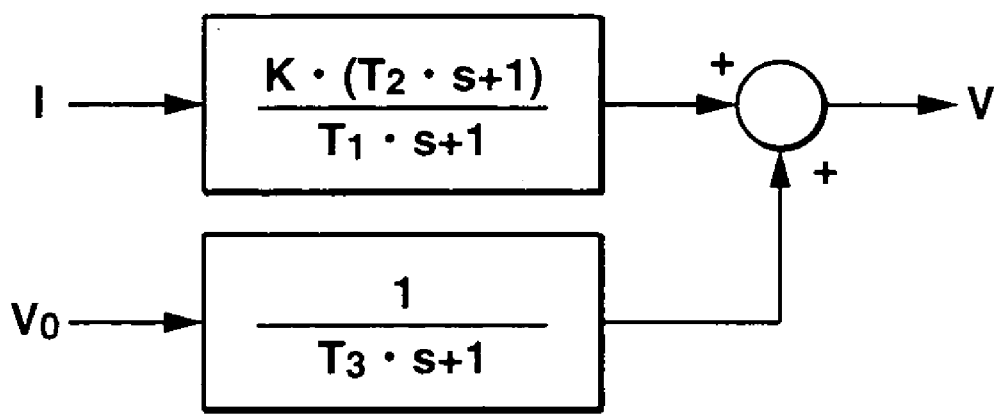
FIG. 5 is a model view representing an equivalent circuit model of the secondary cell in the input and output enabling power estimating apparatus of the second preferred embodiment.

Next, an operation of the second preferred embodiment will be described. First, the cell model used in the second embodiment will be explained below. FIG. 5 shows an equivalent circuit model of the secondary cell in the second embodiment.

Before explaining the equivalent circuit model shown in FIG. 1, equation (1) is described herein.

$$V = \frac{B(s)}{A(s)} \cdot I + \frac{1}{C(s)} \cdot V_o, \tag{1}$$

wherein A(s), B(s), and C(s) denote a poly-nominal of s (n denotes an order number) and $a_1 \neq 0$, $b \neq 0$, and $c_1 \neq 0$.

The equivalent circuit model corresponds to a case where the denominators of the first term and the second term are different as described in equation (1). This equivalent circuit model is a reduction model (first degree or first order) in which a positive pole and a negative pole are not specially separated from each other but can relatively accurately indicate the charge-and-discharge characteristics of the actual cell. In FIG. 5, a model input is current I [A] (positive value indicates the charge and negative value indicates the discharge) and a model output indicates terminal voltage V[V] and Vo[V] indicates open-circuit voltage (referred also to as an electromotive force or open (circuit) voltage). A symbol K denotes the internal resistance. $T_1$ through $T_3$ denotes time constants. This cell model can be expressed as in the following equation (18). It is noted that s denotes a Laplace transform operator. As a lead-acid battery cell (or lead storage battery), the convergence of the open-circuit voltage is very slow cell, the relationship between $T_1 \ll T_3$ is present.

$$V = \frac{K \cdot (T_2 \cdot s + 1)}{T_1 \cdot s + 1} \cdot I + \frac{1}{T_3 \cdot s + 1} \cdot V_o. \tag{18}$$

Equation (18) is a replacement of equation (1) with A(s)=$T_1 \cdot s+1$, B(s)=K·($T_2 \cdot s+1$). First, the derivation of the cell model shown in equation (18) to the adaptive digital filter will be explained below.

The open-circuit voltage Vo can be written with the value of current I multiplied by a variable efficiency h considered as an integration value from a certain initial state.

$$V_0 = \frac{h}{s} \cdot I. \tag{19}$$

If equation (19) is substituted into equation (18), the following equation (20) is given. If arranged, the following equation (21) is given.

$$V = \frac{K \cdot (T_2 \cdot s + 1)}{T_1 \cdot s + 1} \cdot I + \frac{1}{T_3 \cdot s + 1} \cdot \frac{h}{s} \cdot I. \tag{20}$$

-continued $$s \cdot (T_1 \cdot s + 1)(T_3 \cdot s + 1) \cdot V =$$
$$K \cdot (T_2 \cdot s + 1)(T_3 \cdot s + 1) \cdot s \cdot I + h \cdot (T_1 \cdot s + 1) \cdot I$$

$$\{T_1 \cdot T_3 \cdot s^3 + (T_1 + T_3) \cdot s^2 + s\} \cdot V =$$
$$\{K \cdot T_2 \cdot T_3 \cdot s^3 + K \cdot (T_2 + T_3) \cdot s^2 +$$
$$K \cdot (T_2 + T_3) \cdot s^2 + (K + h \cdot T_1) \cdot s + h\} \cdot I$$

$$(a \cdot s^3 + b \cdot s^2 + s) \cdot V = (c \cdot s^3 + d \cdot s^2 + e \cdot s + f) \cdot I. \quad (21)$$

It is noted that the parameters shown in equation (21) is rewritten as follows:

$$a = T_1 \cdot T_3, \; b = T_1 + T_3, \; c = K \cdot T_2 \cdot T_3 \quad$$

$$d = K \cdot (T_2 + T_3), \; e = K + h \cdot T_1, \; f = h \quad (22).$$

If a stable low pass filter G1(s) is introduced into both sides of equation (21) and arranged, the following equation (23) is given.

$$\frac{1}{G_1(s)}(a \cdot s^3 + b \cdot s^2 + s) \cdot V = \frac{1}{G(s)}(c \cdot s^3 + d \cdot s^2 + e \cdot s + f) \cdot I. \quad (23)$$

A value of each of actually measurable current I and terminal voltage V for which low pass filter is processed and band pass filter is processed is defined as shown in an equation (24). In equation (24), $p_1$ denotes a time constant determining the response characteristic of $G_1(s)$.

$$\begin{aligned}
I_0 &= \frac{1}{G_1(s)} \cdot I \\
I_1 &= \frac{s}{G_1(s)} \cdot I \quad V_1 = \frac{s}{G_1(s)} \cdot V \\
I_2 &= \frac{s^2}{G_1(s)} \cdot I \quad V_2 = \frac{s^2}{G_1(s)} \cdot V \\
I_3 &= \frac{s^3}{G_1(s)} \cdot I \quad V_3 = \frac{s^3}{G_1(s)} \cdot V
\end{aligned} \quad \frac{1}{G_1(s)} = \frac{1}{(p_1 \cdot s + 1)^3} \quad (24)$$

If equation (23) is rewritten using variables shown in equation (24), an equation (26) is resulted. If deformed, the following equation (26) is given.

$$a \cdot V_3 + b \cdot V_2 + V_1 = c \cdot I_3 + d \cdot I_2 + e \cdot I_1 + f \cdot I_0; \text{ and}$$

$$V_1 = -a \cdot V_3 - b \cdot V_2 + c \cdot I_3 + d \cdot I_2 + e \cdot I_1 + f \cdot I_0 \quad (25).$$

$$V_1 = [\; V_3 \;\; V_2 \;\; I_3 \;\; I_2 \;\; I_1 \;\; I_0 \;] \begin{bmatrix} -a \\ -b \\ c \\ d \\ e \\ f \end{bmatrix}. \quad (26)$$

Since equation (26) indicates a product-and-sum equation between measurable values and unknown parameters, equation (26) is coincident with a standard form (equation (27)) of a general adaptive digital filter. It is noted that $\omega^T$ means a transposed vector in which a row and a column of a vector $\omega$ are replaced with each other.

$$y = \omega^T \cdot \theta \quad (27).$$

It is noted that $y = V_1$, $$\omega^T = [\; V_3 \;\; V_2 \;\; I_3 \;\; I_2 \;\; I_1 \;\; I_0 \;], \; \theta = \begin{bmatrix} -a \\ -b \\ c \\ d \\ e \\ f \end{bmatrix}$$

Hence, using the adaptive digital filter calculation is used for the filter processed signals by which current I and terminal voltage V are filter processed so that the unknown parameter vector θ can be estimated. In this embodiment, the simple, so-called, both eyes trace gain method is used which improves the logical defect (the accurate estimation cannot again be made once the estimated value is converged) of the adaptive filter by means of the least square method is used. On the premise of equation (27), a parameter estimation algorithm to estimate unknown parameter vector θ is given as in the following equation (28). It is noted that parameter estimated value at a time point of k is assumed to be θ(k).

$$\begin{aligned}
\gamma(k) &= \frac{\lambda_3}{1 + \lambda_3 \cdot \omega^T(k) \cdot P(k-1) \cdot \omega(k)} \\
\theta(k) &= \theta(k-1) - \gamma(k) \cdot P(k-1) \cdot \omega(k) \cdot \\
&\quad [\omega^T(k) \cdot \theta(k-1) - y(k)] \\
P(k) &= \frac{1}{\lambda_1(k)} \left\{ P(k-1) - \frac{\lambda_3 \cdot P(k-1) \cdot \omega(k) \cdot \omega^T(k) \cdot P(k-1)}{1 + \lambda_3 \cdot \omega^T(k) \cdot P(k-1) \cdot \omega(k)} \right\} \\
&= \frac{P'}{\lambda_1(k)} \\
\lambda_1(k) &= \begin{cases} \frac{\text{trace}\{P'(k)\}}{\gamma U} : \; \lambda_1 \leq \frac{\text{trace}\{P'(k)\}}{\gamma U} \\ \lambda_1 : \; \frac{\text{trace}\{P'(k)\}}{\gamma U} \leq \lambda_1 \leq \frac{\text{trace}\{P'(k)\}}{\gamma L} \\ \frac{\text{trace}\{P'(k)\}}{\gamma L} : \; \frac{\text{trace}\{P'(k)\}}{\gamma L} \leq \lambda_1 \end{cases}
\end{aligned} \quad (28)$$

It is noted that $\lambda_1$, $\lambda_3$, $\gamma_U$, and $\gamma_L$ are initial set values and $0 < \lambda_1 < 1$ and $0 < \lambda_2(k) < \infty$. P(0) has a sufficiently large initial value and has a sufficiently small initial value which is not zero. trace{P} means a matrix P trace. In this way, the derivation of the cell model to the adaptive digital filter has been described.

Figure 7:
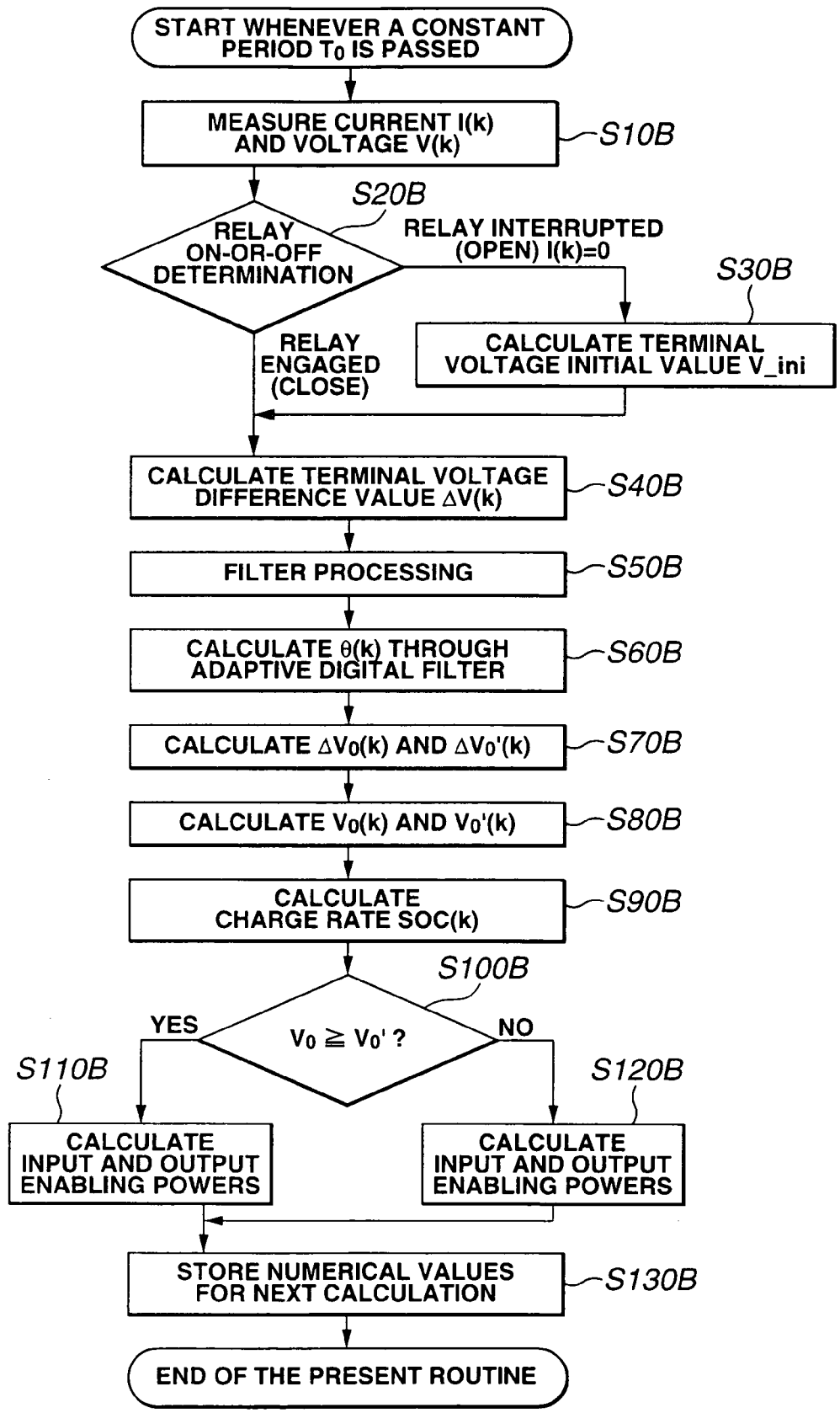
FIG. 7 is a processing flowchart representing a calculation process in the case of the second preferred embodiment of the input and output enabling power estimating apparatus according to the present invention.

FIG. 7 shows an operational flowchart carrying out a microcomputer of battery controller 30. The routine shown in FIG. 7 is executed whenever a constant period of time To has passed. For example, I(k) means the present value and I(k−1) denotes one previous value as described in the first embodiment. In FIG. 7, the contents of steps S10B through S40B are the same as those of steps S10A through S40A described in FIG. 6. Hence, the explanation thereof will herein be omitted. At a step S50B, the low pass filtering and the band pass filtering are carried for current I(k) and terminal voltage difference value ΔV(k) on the basis of the following equation (29) to calculate Io(k) through $I_3(k)$ and $V_1(k)$ through $V_3(k)$.

$$I_0 = \frac{1}{G_1(s)} \cdot I \quad (29)$$

$$I_1 = \frac{s}{G_1(s)} \cdot I \quad V_1 = \frac{s}{G_1(s)} \cdot V$$

$$\frac{1}{G_1(s)} = \frac{1}{(p_1 \cdot s + 1)^3}$$

$$I_2 = \frac{s^2}{G_1(s)} \cdot I \quad V_2 = \frac{s^2}{G_1(s)} \cdot V$$

$$I_3 = \frac{s^3}{G_1(s)} \cdot I \quad V_3 = \frac{s^3}{G_1(s)} \cdot V$$

It is noted that, in this case, in order to improve an estimation accuracy of parameter estimation algorithm of equation (28), the response characteristic of low pass filter $G_1(s)$ is set to be slow so as to reduce the observed noises. However, if the response characteristic of low pass filter $G_1(s)$ is faster than the response characteristic (an approximate value of time constant $T_1$ is already known) of the cell model, each parameter of the cell model cannot accurately be estimated. $P_1$ in equation (29) is a constant determining response characteristic of $G_1(s)$.

At a step S60B, controller 30 substitutes $I_o(k)$ through $I_3(k)$ and $V_1(k)$ through $V_3(k)$ into equation (28). The calculation in accordance with equation (28) which is the parameter estimation algorithm is, then, calculated to determine parameter estimated value $\theta(k)$. It is noted that $y(k)$, $\omega^T(k)$, and $\theta(k)$ are given in the following equation (30).

$$y(k) = V_1(k) \quad (30)$$

$$\omega^T(k) = [\, V_3(k) \quad V_2(k) \quad I_3(k) \quad I_2(k) \quad I_1(k) \quad I_0(k)\,]$$

$$\theta(k) = \begin{bmatrix} -a(k) \\ -b(k) \\ c(k) \\ d(k) \\ e(k) \\ f(k) \end{bmatrix}.$$

At a step S70B, the filtering processes of low pass filter and band pass filter are carried out on the basis of current $I(k)$ and terminal voltage difference value $\Delta V(k)$ on the basis of an equation (34) to calculate $I_4(k)$ through $I_6(k)$ and $V_4(k)$ through $V_6(k)$. a through e from among parameter estimated values $\theta(k)$ calculated at step S60B are substituted into equation (33) which is a deformation from equation (18) to calculate $\Delta Vo$ which is used in place of the open-circuit voltage $Vo$. Since the variation in open-circuit voltage $Vo$ is moderate, $\Delta Vo$ can be substituted. It is noted that the derivation at step S70B is the variation quantity $\Delta Vo(k)$ of the open-circuit voltage $Vo(k)$ from a time at which the estimation calculation is started. Therefore, the initial value is added at a later step S90B. It is noted that, at the derivation of equation (33), K in the equation (32) and e of the equation (33) are strictly different from each other. Physically, $K \gg h \cdot T_1$, e is approximated to K (e is about equal to K, $e \cong K$). In addition, since the approximate value of $T_1$ of the cell parameter is known as several seconds, $t_1$ in equation (34) is set to a value near to the approximate value of $T_1$. Thus, since a term of $(T_1 \cdot s + 1)$ which is rested on a numerator in equation (33) can be cancelled, the estimation accuracy of open-circuit voltage $Vo$ can be improved.

$$\frac{1}{T_3 \cdot s + 1} \cdot V_0 = V - \frac{K \cdot (T_2 \cdot s + 1)}{T_1 \cdot s + 1} \cdot I \quad (31)$$

$$(T_1 \cdot s + 1) \cdot V_0 = (T_1 \cdot s + 1)(T_3 \cdot s + 1) \cdot V - K \cdot (T_2 \cdot s + 1)(T_3 \cdot s + 1) \cdot I$$

$$(T_1 \cdot s + 1) \cdot V_0 = \{(T_1 \cdot T_3 \cdot s^2 + (T_1 + T_3) \cdot s + 1\} \cdot V - \{K \cdot T_2 \cdot T_3 \cdot s^2 + K \cdot (T_2 + T_3) \cdot s + K\} \cdot I.$$

$$\frac{(T_1 \cdot s + 1)}{G_2(s)} \cdot V_0 = \frac{1}{G_2(s)}(a \cdot s^2 + b \cdot s + 1) \cdot V - \frac{1}{G_2(s)}(c \cdot s^2 + d \cdot s + K) \cdot I. \quad (32)$$

$$\Delta V_0 = \frac{(T_1 \cdot s + 1)}{G_2(s)} \cdot V_0 \quad (33)$$

$$= a \cdot V_6 + b \cdot V_5 + V_4 - c \cdot I_6 - d \cdot I_5 - e \cdot I_4.$$

In equation (33), $a = T_1 \cdot T_3$, $b = T_1 + T_3$, $c = K \cdot T_2 \cdot T_3$, $d = K \cdot (T_2 + T_3)$, $e = K + h \cdot T_1 \approx K$. (34)

$$I_4 = \frac{1}{G_2(s)} \cdot I, \quad V_4 = \frac{1}{G_2(s)} \cdot V,$$

$$I_5 = \frac{s}{G_2(s)} \cdot I, \quad V_5 = \frac{s}{G_2(s)} \cdot V, \quad \frac{1}{G_2(s)} = \frac{1}{p_2 \cdot s + 1} \cdot \frac{1}{T_1 \cdot s + 1},$$

$$I_6 = \frac{s^2}{G_2(s)} \cdot I, \quad V_6 = \frac{s^2}{G_2(s)} \cdot V,$$

When the calculated $\Delta Vo(k)$ is substituted into an equation (35), estimated value $\Delta Vo'(k)$ only at a right side second term of cell model (refer to equation (18)) is calculated. $Vo(k)$ denotes an estimate value of the open-circuit voltage itself approximated by equation (18) and $Vo'$ denotes an apparent estimated value of the open-circuit voltage appearing on the terminal voltage. It is, however, noted that, in the derivation of equation (35), $T_3$ at the right side is strictly different from right side b. Physically, since $T_3 \gg T_1$, $b = T_3 + T_1 \approx T_3$.

$$\Delta V_0' = \frac{1}{T_3 \cdot s + 1} \cdot \Delta V_o \cong \frac{1}{b \cdot s + 1} \cdot \Delta V_o. \quad (35)$$

Equation (35) corresponds to Vo/C(s). That is to say, $$Vo = \Delta Vo \text{ and } C(s) = T_3 \cdot s + 1 \approx b \cdot s + 1.$$

At a step S80B of FIG. 7, the open-circuit voltage initial value, namely, terminal voltage initial value $V\_{ini}$ is added to each of $Vo(k)$ and $Vo'(k)$ calculated at step S70B. That is to say, open-circuit voltage estimated value $Vo(k)$ is calculated using the equation (36) and apparent open-circuit voltage estimated value $Vo'(k)$ is calculated using the following equation (37). It is noted that estimated value $Vo'$ is not the estimated value $Vo'$ of open-circuit voltage $Vo$ itself but the apparent open-circuit voltage estimated value appearing on the terminal voltage.

$$V_o(k) = \Delta V_1(k) + V\_{ini} \quad (36).$$

$$Vo'(k) = \Delta Vo'(k) + V\_{ini} \quad (37).$$

At a step S90B, battery controller 30 calculates charge rate SOC(k) from $Vo(k)$ calculated at step S80B using the correlation map between the open-circuit voltage and charge rate shown in FIG. 3. It is noted that $V_L$ shown in FIG. 3 is the open-circuit voltage corresponding to SOC=0% and $V_H$ is the open-circuit voltage corresponding to SOC=100%. At a step S100B, battery controller 30 determines whether estimated value Vo(k) is equal to or larger than open-circuit voltage estimated value Vo'(k). This determination at step S100B functions to search either one of which is nearer to either maximum enabling voltage $V_{max}$ or minimum enabling voltage $V_{min}$. It is noted that maximum enabling voltage $V_{max}$ or minimum enabling voltage $V_{min}$ is a variable determined by the kinds of cells and temperature in the cell. The calculation method is the well known method so that they can be determined using the well known technique as described in the first embodiment. At step S100B, if Vo'(k)≧ Vo(k), the routine goes to a step S110B. If Vo'(k)<Vo(k), the routine goes to a step S120B. At a step S110B, battery controller 30 calculates input enabling power estimated value $P_{in}$ and output enabling power estimated value $P_{out}$. In the cell model (equation (18)), the cell model is expressed in equation (38) in a case where a transient characteristic is ignored and this means a quantitative cell model. To calculate input enabling power estimated value $P_{in}$, the current value to reach to maximum enabling voltage $V_{max}$ is needed. Hence, maximum input current $I_{in\_max}$ is calculated using equation (38) in which the transient characteristic is ignored. That is to say, at step S110B, since Vo'(k)≧Vo(k), Vo'(k) is nearer to maximum enabling power $V_{max}$ and Vo(k) is nearer to minimum enabling voltage $V_{min}$. Hence, in order to calculate input enabling power estimated value $P_{in}$, maximum enabling power voltage $V_{max}$ is substituted for V of equation (38), estimated value e from among parameter estimated values θ(k) calculated at step S60B is substituted for K of equation (38), and Vo'(k) calculated at step S80B is substituted for Vo of equation (38) so that maximum input current $I_{in\_max}$ is calculated from equation (38) obtained from equation (39).

$$V = K \cdot I + V_o \quad (38).$$

$$V_{max} = e \cdot I_{in\_max} + V_o' \quad (39)$$

On the other hand, for output enabling power estimated value $P_{out}$, minimum enabling voltage $V_{min}$ is substituted into V, one of parameter estimated values, viz., e from among parameter estimated values θ(k) calculated at step S60B is substituted into K, open-circuit voltage estimated value Vo(k) calculated at step S80B is substituted for Vo of equation (38). The obtained equation is an equation (40) to calculate maximum output current $I_{out\_max}$.

$$V_{min} = e \cdot I_{out\_max} + V_o \quad (40).$$

Next, using maximum input current $I_{in\_max}$, maximum output current $I_{out\_max}$ derived as described above, equations (41A and 41B) calculate an input enabling power estimated value ($P_{in}$) and an output enabling power estimated value ($P_{out}$).

It is noted that, at the derivation of maximum input current $I_{in\_max}$ and maximum output current $I_{out\_max}$, K in equation (38), e in equations (39) and (40) are strictly different from one another, However, since, physically, K>>h·T₁, e=K+h·T₁≈K.

$$P_{in} = I_{in\_max} \cdot V_{max} \qquad (41A)$$
$$= \frac{V_{max} - V_o'}{e} \cdot V_{max}$$
$$= \frac{V_{max} - \frac{V_o}{b \cdot s + 1}}{e} \cdot V_{max}.$$

-continued $$P_{out} = |I_{out\_max}| \cdot V_{min} \qquad (41B)$$
$$= \frac{V_o - V_{min}}{e} \cdot V_{min}.$$

At a step 120B, battery controller 30 calculates input enabling power estimated value $P_{in}$ and output enabling power estimated value $P_{out}$. Since step S120B is the case where Vo'(k)<Vo(k), Vo(k) is nearer to maximum enabling voltage $V_{max}$ and Vo'(k) is nearer to minimum enabling voltage $V_{min}$. Hence, in order to calculate input enabling power estimated value $P_{in}$, maximum enabling voltage $V_{max}$, estimated value e from among parameter estimated value θ(k) calculated at step S60B using an equation (42) obtained by substituting Vo(k) calculated at step S80B into equation (38). Thus, an equation (43) is given. Maximum output enabling current $I_{out\_max}$ is calculated using equation (43).

$$V_{max} = e \cdot I_{in\_max} + V_o \quad (42).$$

$$V_{min} = e \cdot I_{out\_max} + V_o' \quad (43).$$

Next, using maximum input current $I_{in\_max}$ and maximum output current $I_{out\_max}$, input enabling power estimated value $P_{in}$ and output enabling power estimated value $P_{out}$ are calculated from equations (44A) and (44B) as will be described below.

$$P_{in} = I_{in\_max} \cdot V_{max} \qquad (44A)$$
$$= \frac{V_{max} - V_0}{e} \cdot V_{max}.$$

$$P_{out} = |I_{out\_max}| \cdot V_{min} \qquad (44B)$$
$$= \frac{V_o' - V_{min}}{e} \cdot V_{min}$$
$$= \frac{\frac{V_o}{b \cdot s + 1} - V_{min}}{e} \cdot V_{min}.$$

At a step S130B, battery controller 30 stores numerical values needed for the next calculation and the present calculation is ended. The second preferred embodiment of the estimating apparatus according to the present invention has been described.

Next, the action and advantages of the second embodiment of the estimating apparatus will be described below. In the second embodiment, the relationship from among current I of the secondary cell, terminal voltage V, and open-circuit voltage Vo is constituted to be approximated by means of the transfer function such as equation (1) (specifically, equation (18)), it is possible to apply to the adaptive digital filter of the method of least squares. Consequently, it becomes possible to integrally estimate the parameters at one time (coefficients of poly-nominals of A(s), B(s), and C(s)). Since the estimated parameters are substituted into equation (1), the estimated value of open-circuit voltage Vo can easily be calculated. These unknown parameters are affected by a charge rate (SOC, viz., State Of Charge), an ambient temperature of secondary cell, and a degree of deterioration is varied instantaneously (continuously) with respect to time. However, the sequential estimation can be made with a high accuracy by means of the adaptive digital filter. Since input enabling power $P_{in}$ and output enabling power $P_{out}$ are estimated using the estimated coefficients (parameters) and the open-circuit voltage Vo. Hence, even if, together with the variation in cell parameters during the charge-and-discharge operation, the input and output enabling powers $P_{in}$ and $P_{out}$ are varied, the adaptive digital filter can accurately follow its variation so that the input and output enabling powers can accurately be estimated.

FIG. 9A through 9J integrally show a simulation result of the input output enabling power estimations based on the second embodiment. In FIG. 9A through 9J, with a time of 500 seconds as a boundary, the cell parameters are varied from a low temperature corresponding value to a high temperature corresponding value in a stepwise manner. In the case of the simulation, as far as a time constant of a first-order lag described in the cell model (equation (18)) is concerned, $T_1 \ll T_3$ is set. This is because, the cell having the very slow convergence characteristic of open-circuit voltage Vo like the lead-acid battery is assumed and set.

As appreciated from FIGS. 9A through 9J, parameter estimated values a through e that the adaptive digital filter outputs are coincident with their real values even if the cell parameter given when the simulation is carried out is varied in the stepwise manner (substantially at a right angle). Hence, the open-circuit voltage estimated value are coincident with the real values. In the second embodiment, input enabling power $P_{in}$ is estimated using the estimated coefficient parameter, open-circuit voltage Vo, and maximum enabling voltage $V_{max}$. Hence, even if the cell parameter and open-circuit voltage Vo are instantaneously varied with respect to time (or continuously varied with respect to time), the output enabling power estimated value can be coincident with the real value. It is noted that an attention needs to be paid to develop the first-order lag of time constant $T_3$ in an apparent appearance on the real value of the open-circuit voltage and the terminal voltage (refer to right side second term of equation (18) of the cell model).

In addition, in the input enabling power $P_{in}$ of FIG. 9I, a characteristic of reference (a dot-and-dash line) shown in FIG. 9I indicates a value calculated using the open-circuit voltage estimated value. As shown in FIGS. 9A through 9J, the input enabling power estimated value (dot-and-dash line) calculated using the open-circuit voltage estimated value is larger than the real value of the input enabling power. This is caused by the fact that the apparent open-circuit voltage is larger than the real value of the open-circuit voltage Vo and is nearer to maximum enabling voltage $V_{max}$. In details, in a case where the input (charge) is carried out to the cell using the dot-and-dash lined input enabling power estimated value, there is a possibility that, in this case, the input enabling power real value breaks through maximum enabling voltage $V_{max}$ of the cell and the cell is deteriorated due to the overcharge. However, in the second embodiment, from the estimated coefficient parameters and open-circuit voltage Vo, the apparent open-circuit voltage Vo/C(s). (corresponds to $\Delta Vo'$ in equation (35)) is calculated. Using one of Vo and Vo/C(s) which is nearer to maximum enabling voltage $V_{max}$, the estimated parameters, and maximum enabling voltage $V_{max}$, input enabling power $P_{in}$ is estimated. Hence, in the case of FIGS. 9A through 9J, the input enabling power estimated value (solid line) is calculated using apparent open-circuit voltage Vo/C(s) nearer to maximum enabling power estimated value $V_{max}$ (solid line). Thus, the input enabling power estimated value is sufficiently coincident with the real value thereof and there is no possibility that the input enabling power estimated value breaks through the maximum enabling power voltage of the cell.

On the other hand, in the column of output enabling power $P_{out}$ in FIG. 9J, the characteristic described as the reference (dot-and-dash line) indicates a value calculated using the apparent open-circuit voltage estimated value. As shown in FIG. 9J, the output enabling power estimated value (a dot-and-dash line) calculated using the apparent open-circuit voltage estimated value is larger than the real value of the output enabling power. This is caused by the fact that the open-circuit voltage estimated value is smaller than the apparent open-circuit voltage and is nearer to minimum enabling voltage $V_{min}$. In details, in a case where the cell is outputted (discharged) using the dot-and-dash lined output enabling power estimated value, this output enabling power estimated value breaks through minimum enabling voltage $V_{min}$ so that there is a possibility that the cell is deteriorated due to an over-discharge. However, in the second embodiment, the apparent open-circuit voltage Vo/C(s) is calculated from the estimated coefficient parameters and open circuit enabling voltage $V_{min}$. Using one of Vo and Vo/C(s) which is nearer to minimum enabling voltage $V_{min}$, the estimated coefficient parameters, and minimum enabling voltage $V_{min}$, output enabling power $P_{out}$ is estimated. Hence, in the case of FIGS. 9A through 9J, the output enabling power estimated value (solid line) is calculated using the open-circuit voltage Vo which is nearer to minimum enabling power $V_{min}$. Hence, the estimated value of the output enabling power is sufficiently coincident with the real value and there is no possibility that the output enabling power estimated value breaks through minimum enabling voltage $V_{min}$ of the cell. It is noted that the relay described at steps S20A and S20B shown in FIGS. 6 and 7 corresponds to relay 70 shown in FIG. 2.

The entire contents of a Japanese Patent Application No. 2003-054035 (filed in Japan on Feb. 28, 2003) are herein incorporated by reference. The scope of the invention is defined with reference to the following claims.

What is claimed is:

1. An estimating apparatus for a secondary cell, comprising:
   a current detecting section that detects a current (I) charged into and discharged from the secondary cell;
   a voltage detecting section that detects a terminal voltage (V) across the secondary cell;
   a parameter estimating section that integrally estimates all parameters ($\theta$) at one time in at least one of the following equations (1) and (2) with the measured current (I) and terminal voltage (V) inputted into an adaptive digital filter using a cell model described in a corresponding one of the following equations (1) and (2) whose parameters are estimated;
   an open-circuit voltage calculating section that calculates an open-circuit voltage (Vo) using the current (I), the terminal voltage (V), and the parameter estimated values ($\theta$);
   an input enabling power estimating section that estimates an input enabling power ($P_{in}$) of the secondary cell on the basis of the parameter estimated values ($\theta$) and open-circuit voltage (Vo); and
   an output enabling power estimating section that estimates an output enabling power ($P_{out}$) of the secondary cell on the basis of the parameter estimated values and the open-circuit voltage (Vo), the equation (1) being $$V = \frac{B(s)}{A(s)} \cdot I + \frac{1}{C(s)} \cdot Vo, \text{ wherein} \quad (1)$$

$$A(s) = \sum_{k=0}^{n} a_k \cdot s^k, B(s) = \sum_{k=0}^{n} b_k \cdot s^k, C(s) = \sum_{k=0}^{n} c_k \cdot s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and the equation (2) being $$V = \frac{B(s)}{A(s)} \cdot I + \frac{1}{A(s)} \cdot Vo, \text{ wherein} \quad (2)$$

$$A(s) = \sum_{k=0}^{n} a_k \cdot s^k \text{ and } B(s) = \sum_{k=0}^{n} b_k \cdot s^k.$$

2. An estimating apparatus for a secondary cell as claimed in claim 1, wherein the adaptive digital filter uses the cell model described in the equation (1) and the parameter estimating section integrally estimates all of the parameters (θ) in the equation (1) at one time and wherein, in a case where the terminal voltage of the secondary cell immediately before the secondary cell becomes a predetermined excessive charge is assumed to be a maximum enabling voltage ($V_{max}$) and the terminal voltage of the secondary cell immediately before the secondary cell becomes a predetermined excessive discharge is assumed to be a minimum enabling voltage ($V_{min}$), the input enabling power estimating section estimates the input enabling power ($P_{in}$) of the secondary cell on the basis of the parameter estimated values (θ), the open-circuit voltage (Vo), and the maximum enabling voltage ($V_{max}$) and the output enabling power estimating section estimates the output enabling power ($P_{out}$) of the secondary cell on the basis of the parameter estimated values (θ), the open-circuit voltage (Vo), and the minimum enabling voltage ($V_{min}$).

3. An estimating apparatus for a secondary cell as claimed in claim 2, wherein the input enabling power estimating section calculates Vo/C(s) from the parameter estimated values and the open-circuit voltage (Vo) and the input enabling power estimating section estimates the input enabling power ($P_{in}$) of the secondary cell on the basis of one of the open-circuit voltage (Vo) and the calculated (Vo/C(s)) whose value is nearer to the maximum enabling voltage ($V_{max}$), the parameter estimated values (θ), and the minimum enabling voltage ($V_{min}$).

4. An estimating apparatus for a secondary cell as claimed in claim 2, wherein the output enabling power estimating section calculates Vo/C(s) from the parameter estimated values (θ) and the open-circuit voltage (Vo) and the output enabling power estimating section estimates the output enabling power ($P_{out}$) of the secondary cell on the basis of one of the open-circuit voltage (Vo) and the calculated Vo/C(s) whose value is nearer to the minimum enabling voltage ($V_{min}$), the parameter estimated values (θ), and the maximum output enabling voltage ($V_{max}$).

5. An estimating apparatus for a secondary cell as claimed in claim 2, wherein the input enabling power estimating section calculates Vo/C(s) from the parameter estimated values (θ) and the open-circuit voltage (Vo) and estimates the input enabling power ($P_{in}$) of the secondary cell on the basis of one of the open-circuit voltage (Vo) and the calculated Vo/C(s) whose value is nearer to the maximum enabling voltage ($V_{max}$), the parameter estimated values (θ), and the maximum enabling voltage ($V_{max}$) and wherein the output enabling power estimating section estimates the output enabling power ($P_{out}$) of the secondary cell on the basis of one of the open-circuit voltage (Vo) and the calculated Vo/C(s) whose value is nearer to the minimum enabling voltage ($V_{min}$).

6. An estimating apparatus for a secondary cell as claimed in claim 5, wherein the input enabling power estimating section estimates the input enabling power ($P_{in}$) using the following equation:

$$P_{in} = I_{in\_max} \cdot V_{max}$$
$$= \frac{V_{max} - V_0}{e} \cdot V_{max},$$

wherein $I_{in\_max}$ denotes a maximum input current to the secondary cell calculated from the following equation: $V = K \cdot I + V_0$, wherein e is substituted for K, $V_{max}$ is substituted into V, $I_{in\_max}$ is substituted for I, and $V_0(k)$ is substituted for Vo, $V_0(k) = \Delta Vo(k) + V\_{ini}$, wherein $V_0(k)$ is substituted for $\Delta Vo(k)$ and $V\_{ini}$ denotes an initial value of the terminal voltage when no current from the secondary cell is caused to flow, and $e = K + h \cdot T_1 \approx K$, wherein K denotes one of the parameter estimated values (θ) which corresponds to an internal resistance of the secondary cell, when the calculated open-circuit voltage $V_0(k)$ at a time point of k is equal to or higher than an apparent open-circuit voltage $V'_0(k)$ and estimates the input enabling power ($P_{in}$) using the following equation:

$$P_{in} = I_{in\_max} \cdot V_{max}$$
$$= \frac{V_{max} - V'_o}{e} \cdot V_{max}$$
$$= \frac{V_{max} - \frac{V_o}{b \cdot s + 1}}{e} \cdot V_{max},$$

wherein $b = T_3 + T_1 \approx T_3$ and $T_1$ and $T_3$ denotes time constants, when the calculated open-circuit voltage $V_0(k)$ at the time point of k is lower than the apparent open-circuit voltage $V'_0(k)$, wherein $V_0(k) = \Delta Vo(k) + V\_{ini}$, wherein $V_0(k) = \Delta Vo(k)$, when the calculated open-circuit voltage $V_0(k)$ at the time point of k is lower than an apparent open-circuit voltage $V'_0(k)$.

7. An estimating apparatus for a secondary cell as claimed in claim 6, wherein the output enabling power estimating section estimates the output enabling power ($P_{out}$) using the following equation:

$$P_{out} = |I_{out\_max}| \cdot V_{min}$$
$$= \frac{V_o - V_{min}}{e} \cdot V_{min},$$

when the calculated open-circuit voltage Vo(k) at the time point of k is equal to or higher than the apparent open-circuit voltage Vo'(k) and $$P_{out} = |I_{out\_max}| \cdot V_{min}$$
$$= \frac{V'_o - V_{min}}{e} \cdot V_{min}$$
$$= \frac{\frac{V_o}{b \cdot s + 1} - V_{min}}{e} \cdot V_{min},$$

when the calculated open-circuit voltage ($V_0(k)$) at the time point of k is lower than the apparent open-circuit voltage ($V'_0(k)$) at the time point of k.

8. An estimating apparatus for a secondary cell as claimed in claim 7, wherein $$\Delta V'_0 = \frac{1}{T_3 \cdot s + 1} \cdot \Delta V_0 \cong \frac{1}{b \cdot s + 1} \cdot \Delta V_0$$

corresponds to Vo/C(s) and wherein $$\Delta V_0 = \frac{(T_1 \cdot s + 1)}{G_2(s)} \cdot V_0$$
$$= a \cdot V_6 + b \cdot V_5 + V_4 - c \cdot I_6 - d \cdot I_5 - e \cdot I_4,$$

and wherein $a=T_1 \cdot T_3$, $b=T_1+T_3$, $c=K \cdot T_2 \cdot T_3$, $d=K \cdot (T_2+T_3)$, $e=K+h \cdot T_1 \approx K$, $G_2(s)$ denotes a low pass filter, $T_1$, $T_2$, and $T_3$ denote each time constant, and $$\begin{bmatrix} I_4 = \frac{1}{G_2(s)} \cdot I & V_4 = \frac{1}{G_2(s)} \cdot V \\ I_5 = \frac{s}{G_2(s)} \cdot I & V_5 = \frac{s}{G_2(s)} \cdot V & \frac{1}{G_2(s)} = \frac{1}{p_2 \cdot s + 1} \cdot \frac{1}{T_1 \cdot s + 1} \\ I_6 = \frac{s^2}{G_2(s)} \cdot I & V_6 = \frac{s^2}{G_2(s)} \cdot V \end{bmatrix}.$$

9. An estimating apparatus for a secondary cell as claimed in claim 8, wherein the open-circuit voltage ($V_0(k)$) at the time point of k is estimated from the following equation:

$$\frac{(T_1 \cdot s + 1)}{G_2(s)} \cdot V_0 = \frac{\frac{1}{G_2(s)}(a \cdot s^2 + b \cdot s + 1) \cdot V -}{\frac{1}{G_2(s)}(c \cdot s^2 + d \cdot s + K) \cdot I.}$$

10. An estimating apparatus for a secondary cell as claimed in claim 9, wherein the parameter estimating section integrally estimates the parameters used in the equation (1) at one time as follows:

$$\theta = \begin{bmatrix} -a \\ -b \\ c \\ d \\ e \\ f \end{bmatrix}$$

wherein f=h and h denotes a variable efficiency derived from the following equation:

$$Vo = \frac{h}{s} \cdot I.$$

11. An estimating apparatus for a secondary cell as claimed in claim 10, wherein the equation (1) is arranged in an equivalent circuit model expressed as:

$$V = \frac{K \cdot (T_2 \cdot s + 1)}{T_1 \cdot s + 1} \cdot I + \frac{1}{T_3 \cdot s + 1} \cdot V_o.$$

12. An estimating apparatus for a secondary cell as claimed in claim 1, wherein the adaptive digital filter uses the cell model described in the equation (2) and the parameter estimating section integrally estimates all parameters ($\theta$) in the equation (2) at one time.

13. An estimating apparatus for a secondary cell as claimed in claim 12, wherein, in a case where the terminal voltage of the secondary cell immediately before the secondary cell becomes a predetermined excessive charge is assumed to be a maximum enabling voltage ($V_{max}$) and the terminal voltage of the secondary cell immediately before the secondary cell becomes a predetermined excessive discharge is assumed to be a minimum enabling voltage ($V_{min}$), the input enabling power estimating section estimates the input enabling power ($P_{in}$) of the secondary cell on the basis of the parameter estimated values ($\theta$) and the open-circuit voltage (Vo), and the maximum enabling voltage ($V_{max}$) and the output enabling power estimating section estimates the output enabling power ($P_{out}$) of the secondary cell on the basis of the parameter estimated values ($\theta$), the open-circuit voltage (Vo), and the minimum enabling voltage ($V_{min}$).

14. An estimating apparatus for a secondary cell as claimed in claim 13, wherein the input enabling power estimating section estimates the input enabling power ($P_{in}$) using the following equation:

$$\begin{aligned} P_{in} &= I_{in\_max} \cdot V_{max} \\ &= \frac{V_{max} - Vo}{K} \cdot V_{max} \end{aligned},$$

wherein $I_{in\_max}$ denotes a maximum input current calculated from an equation: $V=K \cdot I+Vo$, wherein $V_{max}$ is substituted for V and K denotes an internal resistance of the secondary cell which corresponds to one of the parameter estimated values ($\theta$), and $I_{in\_max}$ is substituted for I.

15. An estimating apparatus for a secondary cell as claimed in claim 14, wherein the output enabling power estimating section estimates the output enabling power ($P_{out}$) as follows:

$$\begin{aligned} P_{out} &= |I_{out\_max}| \cdot V_{min} \\ &= \frac{Vo - V_{min}}{K} \cdot V_{min} \end{aligned},$$

wherein $I_{out\_max}$ is a maximum output current calculated from an equation: $V=K \cdot I+Vo$ in which $V_{min}$ is substituted for V and $I_{out\_max}$ is substituted for I.

16. An estimating apparatus for a secondary cell as claimed in claim 15, wherein the open-circuit voltage calculating section calculates the open-circuit voltage estimated value ($V_0(k)$) at a time point of k as follows: $V_0(k)= \Delta V_0(k)+V\_{ini}$, wherein $V\_{ini}$ denotes an initial value of the terminal voltage when no current is caused to flow into the secondary cell and $\Delta V_0(k)=\Delta V_0=G_{lp}(s) \cdot V_0=V_1+T_1 \cdot V_2-K \cdot T_2 \cdot I_2-K \cdot I_1$, wherein $$G_{1p}(s) = \frac{1}{(p \cdot s + 1)^3}, \quad V_2 = s \cdot G_{lp}(s) \cdot V, \quad V_1 = G_{lp}(s) \cdot V,$$
$$I_2 = s \cdot G_{lp}(s) \cdot I, \quad I_1 = G_{lp}(s) \cdot I$$

wherein $G_{lp}(s)$ denotes a low pass filter, p denotes a constant determining a response characteristic of $G_{lp}(s)$, and $T_1$ and $T_2$ denote time constants of an equivalent circuit model of the secondary cell expressed in the equation (2).

17. An estimating apparatus for a secondary cell as claimed in claim 16, wherein the parameter estimating section integrally estimates all parameters used in the equation (2) at one time as follows:

$$\theta = \begin{bmatrix} -T_1 \\ K \cdot T_2 \\ K \\ h \end{bmatrix},$$

wherein h denotes a variable efficiency and is derived from the following equation:

$$V_0 = \frac{h}{s} \cdot I.$$

18. An estimating apparatus for a secondary cell as claimed in claim 16, wherein, in the equation (2), when $(T_1 \cdot s+1)$ is substituted for A(s) and $K \cdot (T_2 \cdot S+1)$ is substituted for B(s), the following equation is established:

$$V = \frac{K \cdot (T_2 \cdot s + 1)}{T_1 \cdot s + 1} \cdot I + \frac{1}{T_1 \cdot s + 1} \cdot V_o.$$

19. An estimating apparatus for a secondary cell, comprising:
current detecting means for detecting a current (I) charged into and discharged from the secondary cell;
voltage detecting means for detecting a terminal voltage (V) across the secondary cell;
parameter estimating means for integrally estimating all parameters (θ) at one time in at least one of the following equations (1) and (2) with the measured current (I) and terminal voltage (V) inputted into an adaptive digital filter using a cell model described in a corresponding one of the following equations (1) and (2) whose parameters are estimated;
open-circuit voltage calculating means for calculating an open-circuit voltage (Vo) using the current (I), the terminal voltage (V), and the parameter estimated values (θ);
input enabling power estimating means for estimating an input enabling power ($P_{in}$) of the secondary cell on the basis of the parameter estimated values (θ) and open-circuit voltage (Vo); and
output power enabling power estimating means for estimating an output enabling power ($P_{out}$) of the secondary cell on the basis of the parameter estimated values and the open-circuit voltage (Vo), the equation (1) being $$V = \frac{B(s)}{A(s)} \cdot I + \frac{1}{C(s)} \cdot Vo, \tag{1}$$

wherein $$A(s) = \sum_{k=0}^{n} a_k \cdot s^k, \quad B(s) = \sum_{k=0}^{n} b_k \cdot s^k, \quad C(s) = \sum_{k=0}^{n} c_k \cdot s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and the equation (2) being $$V = \frac{B(s)}{A(s)} \cdot I + \frac{1}{A(s)} \cdot Vo, \tag{2}$$

wherein $$A(s) = \sum_{k=0}^{n} a_k \cdot s^k \text{ and } B(s) = \sum_{k=0}^{n} b_k \cdot s^k.$$

20. An estimating method for a secondary cell, comprising:
detecting a current (I) charged into and discharged from the secondary cell;
detecting a terminal voltage (V) across the secondary cell;
integrally estimating all parameters (θ) at one time in at least one of the following equations (1) and (2) with the measured current (I) and terminal voltage (V) inputted into an adaptive digital filter using a cell model described in a corresponding one of the following equations (1) and (2) whose parameters are estimated;
calculating an open-circuit voltage (Vo) using the current (I), the terminal voltage (V), and the parameter estimated values (θ);
estimating an input enabling power ($P_{in}$) of the secondary cell on the basis of the parameter estimated values (θ) and open-circuit voltage (Vo); and
estimating an output enabling power ($P_{out}$) of the secondary cell on the basis of the parameter estimated values and the open-circuit voltage (Vo), the equation (1) being $$V = \frac{B(s)}{A(s)} \cdot I + \frac{1}{C(s)} \cdot Vo, \tag{1}$$

wherein $$A(s) = \sum_{k=0}^{n} a_k \cdot s^k, \quad B(s) = \sum_{k=0}^{n} b_k \cdot s^k, \quad C(s) = \sum_{k=0}^{n} c_k \cdot s^k,$$

s denotes a Laplace transform operator, A(s), B(s), and C(s) denote each poly-nominal of s (n denotes degrees), $a_1 \neq 0$, $b_1 \neq 0$, and $c_1 \neq 0$ and the equation (2) being $$V = \frac{B(s)}{A(s)} \cdot I + \frac{1}{A(s)} \cdot Vo, \tag{2}$$

wherein $$A(s) = \sum_{k=0}^{n} a_k \cdot s^k \text{ and } B(s) = \sum_{k=0}^{n} b_k \cdot s^k.$$

* * * * *